United States Patent [19]
Nakama

[11] Patent Number: 5,405,676
[45] Date of Patent: Apr. 11, 1995

[54] FILM FORMING PROCESS

[75] Inventor: Hiroshi Nakama, Numazu, Japan

[73] Assignee: Yamato Kako Kabushiki Kaisha, Kanagawa, Japan

[21] Appl. No.: 81,500

[22] Filed: Jun. 22, 1993

Related U.S. Application Data

[60] Division of Ser. No. 853,892, Mar. 19, 1992, Pat. No. 5,275,693, which is a continuation of Ser. No. 619,263, Nov. 28, 1990, abandoned.

[30] Foreign Application Priority Data

Mar. 30, 1990 [JP] Japan .................................... 2-85292

[51] Int. Cl.⁶ .......................... B32B 5/18; B32B 5/20; B32B 15/04; B32B 18/00; B32B 33/00
[52] U.S. Cl. ................................. 428/198; 428/201; 428/307.7; 428/408
[58] Field of Search .................... 428/198, 201, 307.7, 428/408

[56] References Cited

U.S. PATENT DOCUMENTS

| | | | |
|---|---|---|---|
| 3,152,938 | 10/1964 | Osifchin et al. | 156/656 X |
| 4,407,695 | 10/1983 | Deckman et al. | 156/659.1 X |
| 4,642,163 | 2/1987 | Greschner et al. | 156/659.1 |
| 4,645,734 | 2/1987 | Takada et al. | 427/307 X |
| 4,664,748 | 5/1987 | Ueno et al. | 156/659.1 |
| 4,784,023 | 11/1988 | Dennis | 76/108 A |
| 5,275,693 | 1/1994 | Nakama | 156/644 |

*Primary Examiner*—James C. Cannon
*Attorney, Agent, or Firm*—Sprung, Horn, Kramer & Woods

[57] ABSTRACT

A first film having a low adhesion to a base material (substrate) is deposited on a base material. Pores reaching at least the surface of the base material are then formed through the first film at a high pore density (porosity), for example, according to photolithographic etching technology. Thereafter, a second film having a high adhesion to the base material is formed over the porous first film to fix, or secure, the porous first film to the base material. Recesses may be formed in a surface portion of the base material to further improve the fixation of the porous first film to the base material.

2 Claims, 4 Drawing Sheets

FILM FORMING PROCESS

This is a division of application Ser. No. 07/853,892, filed Mar. 19, 1992, now U.S. Pat. No. 5,275,693 which is a continuation of application Ser. No. 619,263, now abandoned, filed Nov. 28, 1990.

BACKGROUND OF THE INVENTION

1. Field of the Invention

The present invention relates to a film forming process, and more particularly to a novel film forming process wherein a film having a low adhesion to a base material, or substrate, is fixed, or secured, so firmly to the base material as not to be peelable therefrom.

2. Prior Art

It is sometimes desired to apply pattern-wise surface decorations of a precious metal such as gold or platinum to ceramic ware, tile, plastics, jewelry such as a diamond, etc., by metal coating, or precious metal foil adhesion with, for example, glue.

Conventional processes for forming a film on the surface of a base material, or substrate, include electroplating, printing, coating, vacuum evaporation and deposition, sputtering, metallic foil adhesion, underglaze application for ceramic ware, and other various processes.

These processes are, however, employed selectively in accordance with a combination of the kinds of base material and film material and hence cannot be applied to every combination of the kinds of base material and film material. Further, in a particular combination of the kinds of base material and film material, it sometimes happens that no film having a satisfactory adhesion to the base material can be formed according to any of the above-mentioned processes. For example, the adhesions of films formed of precious metals such as gold and platinum to such base materials as ceramics including glass, china and porcelain, plastics, and jewels including a diamond are so low that the films are liable to be peeled off the base materials by mere mechanical contact or the like.

The present invention has been made in view of the foregoing problems of the prior art. Accordingly, an object of the present invention is to provide a film forming process according to which satisfactory fixation can be secured between a base material and a film, the material of which may even be inherently poor in adhesion to the base material.

SUMMARY OF THE INVENTION

In accordance with the present invention, there is provided a film forming process comprising the step of depositing on a base material a first film having a low adhesion to the base material, the step of forming pores reaching at least the surface of the base material through the first film at a high pore density (porosity), and the step of forming over the porous first film a second film having a high adhesion to the base material to fix, or secure, the porous first film to the base material.

The step of pore formation may be carried out in such a way as to form recesses in a surface portion of the base material through the pores of the porous first film.

The above-mentioned base material (substrate) may be formed of any one of ceramic materials including glass, plastic materials, metals, alloys and jewels, which, however, are not restrictive.

Usable materials of the above-mentioned first film include metals such as gold, platinum, silver, indium, copper, nickel, and chromium; alloys of such metals; organometallic compounds such as titanium nitride (TiN); and others.

Usable materials of the above-mentioned second film include glaze, SiO, $SiO_2$, beryllium, aluminum, molybdenum, lead, tungsten, metallic alloys, organometallic compounds, and others.

In principle, the present invention can be applied to every combination of a material of the first film having a low adhesion to a base material with a material of the second film having a high adhesion to the base material.

According to the film forming process of the present invention, the second film is firmly adhered to the base material (substrate) through the pores formed through the first film at a high pore density, while the porous first film is sandwiched between the base material and the second film, with which the pores of the porous first film is filled up. This can keep the porous first film from being peeled off base material even when the porous first film is formed of a material having a low adhesion to the base material.

When recesses are formed in the surface portion of the base material in addition to the formation of the pores through the first film, the area of contact between the second film and the base material is increased as compared with that in the case where no recesses are formed in the surface portion of the base material, while at the same time the second film is formed as if it were nailed into the base material. Therefore, the fixation of the porous first film to the base material is further improved.

BRIEF DESCRIPTION OF THE DRAWINGS

The foregoing and other objects, features and advantages of the present invention will be better understood from the following description taken in connection with the accompanying drawings, in which.

PREFERRED EMBODIMENTS OF THE INVENTION

Figure 1A:
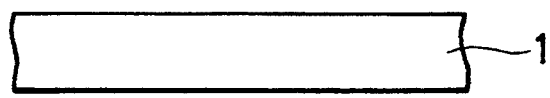
FIGS. 1 (a) to (g) are partial schematic cross-sectional views of the structures formed in major steps in Example 1, which are illustrative of an embodiment of the film forming process of the present invention.
Figure 1B:
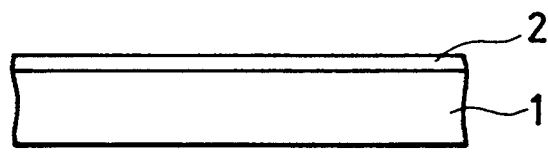
Figure 1C:
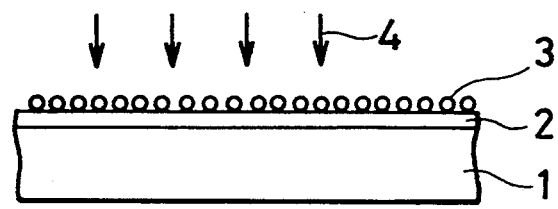
Figure 1D:
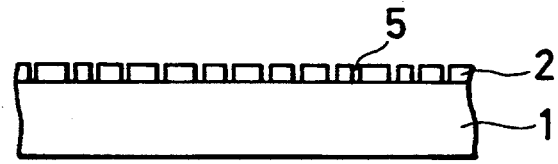
Figure 1E:
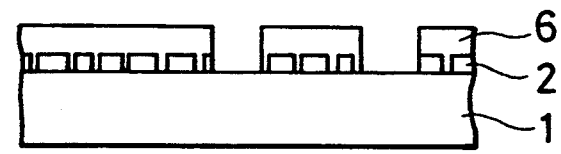
Figure 1F:
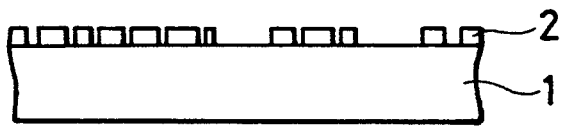
Figure 1G:
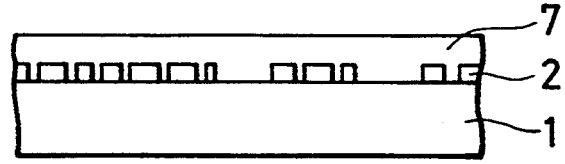

A description will now be made of Examples according to the present invention, while referring to the accompanying drawings.

EXAMPLE 1

FIGS. 1 (a) to (g) are cross-sectional illustrations demonstrating the process of Example 1 according to the present invention, by which an Au film is secured, or fixed, to a ceramic tile base material. The surface of the tile base material 1 (substrate) glazed and fired at a temperature of 1,140° to 1,300° C. (medium firing temperature) is washed with trichloroethylene or the like, and then dried at 100° C. for about one hour.

After the tile base material 1 is transferred into a chamber filled with Ar gas under a pressure of $2 \times 10^{-4}$ Torr, a thin Au film 2 is formed on the tile base material 1 by sputtering.

Subsequently, a suspension of $Al_2O_3$ particles 3 of 2 to 5 $\mu$m in size in a 3 wt. % soap solution is sprayed on the Au film 2, and then dried to stick the $Al_2O_3$ particles 3 onto the Au film 2. While using the $Al_2O_3$ particles 3 as a mask, the Au film 2 is subjected to dry etching with argon ions 4 ($Ar^+$). The dry etching may be effected under an Ar gas pressure of $2 \times 10^{-4}$ Torr at an acceleration voltage of 400 V for 10 minutes. In this etching step, recesses can be formed in a surface portion of the tile base material 1 when the acceleration voltage is further increased sufficiently. Thereafter, the base material with the Au film thereon is washed with water by using an ultrasonic cleansing machine to remove therefrom the $Al_2O_3$ particles 3 and the soap. Thus, a porous Au film 3 having irregular pores formed therethrough at a pore area proportion of 25% is formed. Additionally stated, any other fine particles may be used in place of $Al_2O_3$ particles in so far as they are resistant to etching.

Subsequently, the porous Au film 3 is coated with a resist film 6 of 0.7 $\mu$m in thickness by spin coating. The resist film 6 is subjected to image-wise patterning by photolithographic technology. While using the patterned resist film 6 as a mask, the Au film 2 is partially removed. Thereafter, the patterned resist film 6 is completely removed.

A rakuyaki (raku ware) glaze 7 is applied on the surface of the tile base material 1 with the patterned porous Au film 2 thereon, followed by firing in a furnace at 850° C. The rakuyaki glaze 7 has been prepared by a method comprising preparing frit from red lead, molten borax and flint glass mixed at a ratio of 9:6:2, adding niter to the frit at a niter/frit ratio of 1:17, and pulverizing the resulting mixture.

According to the foregoing procedure, the patterned image of the porous Au film 2 is obtained on the tile base material 1 over which the rakuyaki glaze 7 is applied.

In the foregoing Example 1 according to the present invention, the rakuyaki glaze 7 is firmly adhered to the tile base material 1 through the innumerable pores of the porous Au film 2. Therefore, the porous Au film 2 sandwiched between the rakuyaki glaze 7 and the tile base material 1 is hard to peel off from the tile base material 1.

In accordance with the process of Example 1, an enjoyably brilliant and gorgeous Au pattern can be applied to even a tile base material, the adhesion of Au to which is inherently low.

In Example 1 according to the present invention, the form and state of the pores of the Au film 2 can be arbitrarily controlled by changing the size of $Al_2O_3$ particles and the condition of spraying the suspension thereof.

For example, the hue of the Au film can be turned lighter by increasing the proportion of the pores relative to the whole Au film (pore area proportion). Conversely, when the pore area proportion is decreased, the Au film may look as if it were a substantially non-porous Au film.

EXAMPLE 2

Figure 2A:
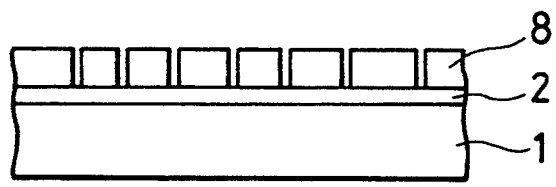
FIGS. 2 (a) to (c) are partial schematic cross-sectional views of the structures formed in major steps in Example 2, which are illustrative of another embodiment of the film forming process of the present invention.
Figure 2B:
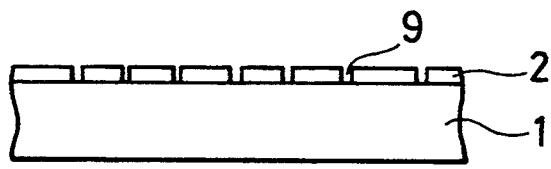
Figure 2C:
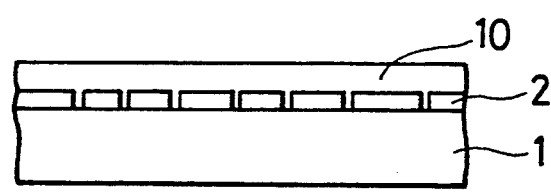

FIGS. 2 (a) to (c) are cross-sectional illustrations demonstrating the process of Example 2 according to the present invention, by which an Au film is secured, or fixed, to a tile base material.

As shown in FIG. 2 (a), a resist film 8 of about 0.7 $\mu$m in thickness formed on an Au film 2 formed on a tile base material 1 glazed and fired at a medium firing temperature is exposed to light through a porous mask not shown in the figure, and then developed to form pores of about 2 $\mu$m in size through the resist film 8. Thereafter, the Au film 2 is subjected to dry etching while using the porous resist film 8 as a mask to form pores 9 through the Au film 2 as shown in FIG. 2 (b).

Subsequently, the whole upper surface is coated with a transparent rakuyaki glaze 10, which is then fired. Thus, the porous Au film 2 is secured, or fixed, to the tile base material 1.

In this Example, the size and number of pores 9 can be arbitrarily controlled by choosing a suitable mask to adequately adjust the degree of fixation of the porous Au film 2 to the tile base material 1 as well as the hue of the porous Au film 2.

When a dotted human figure mask, which is obtained by transferring the image of a human figure photograph to a base material of the mask through a screen, is used in the process of this Example according to the present invention, a clear human figure image in the form of a porous Au film can be obtained on a tile base material 1.

EXAMPLE 3

Figure 3A:
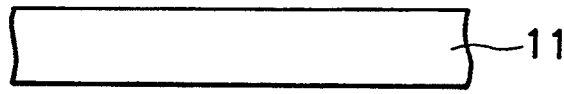
FIGS. 3 (a) to (c) are partial schematic cross-sectional views of the structures formed in major steps in Example 3, which are illustrative of still another embodiment of the film forming process of the present invention.
Figure 3B:
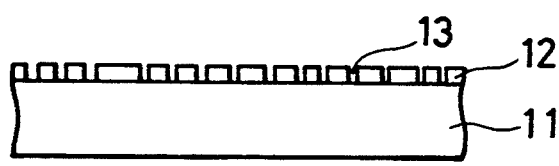
Figure 3C:
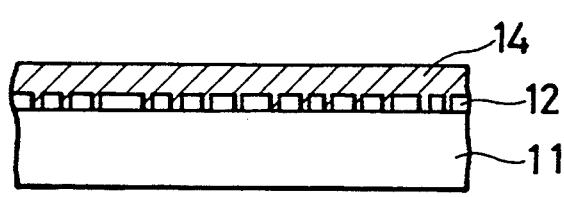
Figure 4A:
FIGS. 4 (a) to (e) are partial schematic cross-sectional views of the structures formed in major steps in Example 4, which are illustrative of a further embodiment of the film forming process of the present invention.
Figure 4B:
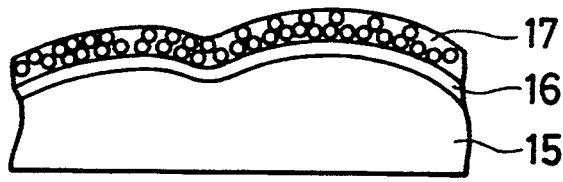
Figure 4C:
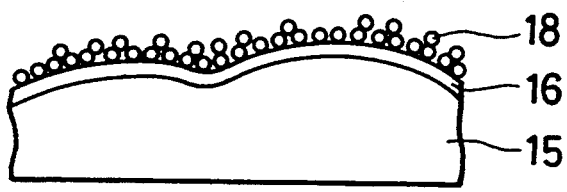
Figure 4D:
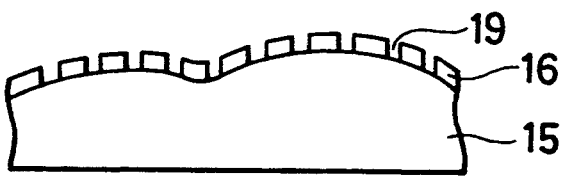
Figure 4E:
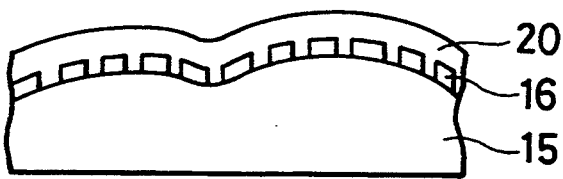
Figure 5A:
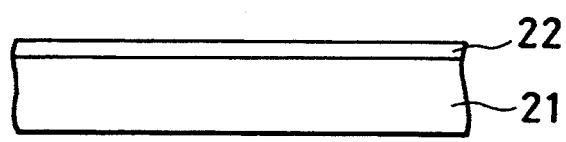
FIGS. 5 (a) to (d) are partial schematic cross-sectional views of the structures formed in major steps in Example 5, which are illustrative of a still further embodiment of the film forming process of the present invention.
Figure 5B:
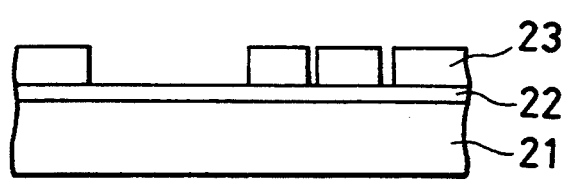
Figure 5C:
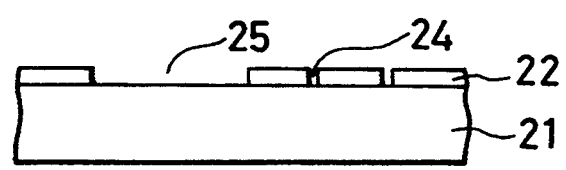
Figure 5D:
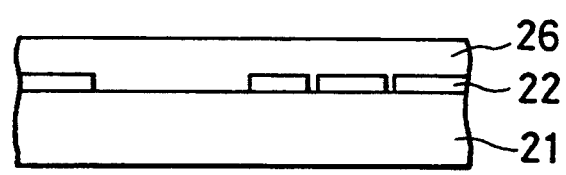

FIGS. 3 (a) to (c) are cross-sectional illustrations demonstrating the process of Example 3 according to the present invention, by which an Au film is secured, or fixed, to a glass plate.

The surface of a glass plate 11 (substrate) of about 1 mm in thickness as shown in FIG. 3 (a) is washed with trichloroethylene, and then dried at 100° C. for about one hour.

Subsequently, the glass plate 11 is transferred into a chamber which is under a pressure of $2 \times 10^{-4}$ Torr, followed by vacuum evaporation and deposition to form a thin Au film 12 of 0.1 to 1 $\mu$m in thickness on the glass plate 11.

Thereafter, pores 13 are formed through the Au film 12 in substantially the same manner as in Example 1 at a pore area proportion of about 10% [see FIG. 3 (b)]. A Cr film 14 of 5 to 30 $\mu$m in thickness is then deposited on the Au film 12 by sputtering [see FIG. 3 (c)].

According to the foregoing procedure, a golden mirror having a reflective surface of the porous Au film 12 with the opaque Cr film 14 at the rear thereof is obtained. In this Example as well, the porous Au film 12 is hard to peel off because the porous Au film 12 is sandwiched between the glass plate 11 and the Cr film 14 firmly adhered thereto through the pores 13 of the porous Au film 12.

EXAMPLE 4

FIGS. 4 (a) to (e) are cross-sectional illustrations demonstrating the process of Example 4 according to the present invention, by which an Au film is secured, or fixed, to a plastic relief.

The surface of a plastic relief 15 is cleansed. A thin Au film 16 of 0.1 to 1 μm in thickness is then formed on the cleansed surface of the plastic relief 15 by sputtering [see FIG. 4 (a)].

$Al_2O_3$ particles of 2 to 5 μm in size are mixed with a 3 wt. % solution of starch to prepare a suspension 17. The plastic relief 15 with the Au film 16 thereon is then dipped in the suspension 17 and taken out to adhere a thin film of the suspension 17 to the surface of the Au film 16 [see FIG. 4 (b).

After drying at ordinary temperatures, the $Al_2O_3$ particles 18 are fixed to the surface of the Au film 16 [see FIG. 4 (c)].

The Au film 16 is then subjected to dry etching while using the $Al_2O_3$ particles 18 as a mask to form pores 19 through the Au film 16 [see FIG. 4 (d)].

After washing with water to remove the $Al_2O_3$ particles 18 and the starch, the plastic relief 15 with the porous Au film 16 thereon is dipped in an ordinary-temperature liquid, prepared by adding silica gel to an aqueous solution of $H_2SiF_6$ (hydrosilicofluoric acid) to form a sol or colloidal solution of the silica gel and adding a solution of boric acid to the resulting mixture, for a dipping period of time of 15 hours, and then taken out to form an $SiO_2$ film 20 of 0.3 μm in thickness covering the porous Au film 16 as shown in FIG. 4 (e).

The $SiO_2$ film 20 is firmly adhered to the plastic relief 15 through the pores 19 of the porous Au film 16 to keep the porous Au film 16 from being peeled off the plastic relief 15. Furthermore, the interference colors of light manifested by virtue of the suitable thickness of the transparent $SiO_2$ film 20 are mixed with the brilliant golden color of the porous Au film 16 to provide enjoyable composite colors.

In this Example in particular, since the $Al_2O_3$ particles 18 can be fixed to the Au film 16 through dipping in the suspension 17 of the $Al_2O_3$ particles 18, the spread of the $Al_2O_3$ particles 18 over the Au film 16 can be easily effected uniformly even in the case of the plastic relief 15 whose surface is not flat. This results in uniform formation of the pores 19 through the Au film 16 all over the curved surface of the plastic relief 15. This enables the porous Au film 16 to be secured, or fixed, to even the curved surface of the plastic relief 15.

According to substantially the same procedure as described above, an Au film can be secured, or fixed, to a lead or like statue of Buddha having a curved surface. Accordingly, a golden statue of Buddha coated with a protective film such as an $SiO_2$ film or an SiO film to improve the durability thereof can be very easily produced.

EXAMPLE 5

FIGS. 5 (a) to (d) are cross-sectional illustrations demonstrating the process of Example 5 according to the present invention, by which a Pt film is secured, or fixed, to a diamond substrate.

The surface of a diamond substrate 21 is cleansed. A Pt film 22 of 0.1 to 1 μm in thickness is formed on the cleansed surface of the diamond substrate 21 by sputtering [see FIG. 5 (a)].

Subsequently, a resist film 23 is formed on the Pt film 22 and then subjected to patterning to form a predetermined pattern of the resist film 23 including pores [see FIG. 5 (b)]. While using the above-mentioned pattern of the resist film 23 as a mask, the Pt film 22 is subjected to dry etching to form pores 24 and an opening 25 through the Pt film 22 [see FIG. 5 (c)].

Thereafter, a transparent protective film 26 of diamond 0.05 μm in thickness is formed all over the surface of the diamond substrate 21 with the patterned porous Pt film 22 thereon by sputtering. Thus, the desired product comprising the diamond substrate 21, the predetermined pattern of the porous Pt film 22 formed thereon and the protective film 26 formed thereon as shown in FIG. 5 (d) is obtained.

In this Example, since the transparent protective film 26 of diamond is firmly adhered to the diamond substrate 21 through the pores 24 of the porous Pt film 22, the porous Pt film 22 sandwiched between the diamond substrate 21 and the protective film 26 is firmly fixed.

The porous Pt film 22 is improved in durability since it is covered with the transparent protective film 26 made of diamond.

In view of the above, when the process of this Example is applied to production of ornaments such as earrings and necklaces, durable and gorgeous ornamental products can be obtained.

While representative embodiments of the present invention have been described in the foregoing Examples, the present invention is not limited to these embodiments, but widely applicable as an effective process for fixing to a base material (substrate) a film having a low adhesion to the base material on the basis of the principle of the present invention.

As described hereinbefore, since the film forming process of the present invention provides a structure wherein the second film is firmly adhered to the base material through the pores of the porous first film with a high pore density, the first film, even if poor in adhesion to the base material, can be prevented from being peeled off the base material.

When the recesses are formed in the surface portion of the base material through the pores of the porous first film to increase the area of contact between the base material and the second film, as compared with that in the case of no recesses in the surface portion of the base material, while at the same time presenting an effect of the second film being nailed into the recesses in addition to the effect of the pores formed through the first film, the fixation of the first film to the base material is further improved.

Thus, according to the present invention, films of, for example, precious metals, which have heretofore involved a difficulty in use thereof because of the poor adhesions thereof, can be formed into an enjoyable and gorgeous pattern-wise or letter-like design and can be secured, or fixed, to a variety of articles.

The first film may be of a thickness of about 0.05 to 10 μm, preferably about 0.1 to 0.5 μm. The pores therethrough may range in diameter from about 0.1 to 100 μm. The second film may range in thickness from about 0.02 to 50 and preferably from about 0.05 to 30 μm.

It will be appreciated that the instant specification and claims are set forth by way of illustration and not limitation, and that various modifications and changes may be made without departing from the spirit and scope of the present invention.

What is claimed is:

1. An ornamental product comprising a diamond base material, a protective layer of diamond thereon and a metal film disposed therebetween, whereby said protective layer adheres firmly to said based material through pores and/or openings formed in said metal film.

2. An ornamental product in accordance with claim 1, wherein said metal film is figures with a desired pattern.

* * * * *